United States Patent
Park et al.

(10) Patent No.: US 10,044,376 B2
(45) Date of Patent: Aug. 7, 2018

(54) APPARATUS AND METHOD FOR CONTROLLING TRANSMISSION

(71) Applicant: Samsung Electronics Co., Ltd., Gyeonggi-do (KR)

(72) Inventors: Changjoon Park, Gyeonggi-do (KR); Il-Soo Kim, Seoul (KR); Youngil Son, Gyeonggi-do (KR); Dong Woo Lee, Gyeonggi-do (KR)

(73) Assignee: Samsung Electronics Co., Ltd (KR)

(*) Notice: Subject to any disclaimer, the term of this patent is extended or adjusted under 35 U.S.C. 154(b) by 106 days.

(21) Appl. No.: 15/176,887

(22) Filed: Jun. 8, 2016

(65) Prior Publication Data

US 2016/0366683 A1  Dec. 15, 2016

(30) Foreign Application Priority Data

Jun. 12, 2015 (KR) .................. 10-2015-0083396
Oct. 5, 2015 (KR) .................. 10-2015-0139635

(51) Int. Cl.
*H04J 3/02* (2006.01)
*H04B 1/04* (2006.01)
*H03F 3/24* (2006.01)

(52) U.S. Cl.
CPC ............. *H04B 1/04* (2013.01); *H03F 3/24* (2013.01); *H04B 2001/0408* (2013.01)

(58) Field of Classification Search
CPC .. H04L 5/14; H04L 5/1423; H04L 5/16; H04J 1/10; H04J 1/00; H04J 3/00; H04J 3/1682; H04J 3/22; H04B 1/04; H04B 2001/0408; H03F 3/24; H04Q 11/04; H04N 21/2368

USPC ....... 370/267, 278, 281, 282, 295, 482, 492, 370/498, 532, 535, 537, 538, 540
See application file for complete search history.

(56) References Cited

U.S. PATENT DOCUMENTS

| | | | |
|---|---|---|---|
| 8,461,931 B1 | 6/2013 | Bayruns et al. | |
| 8,525,895 B2 | 9/2013 | Cote et al. | |
| 8,791,719 B2 | 7/2014 | Ripley | |
| 8,954,019 B2 | 2/2015 | George et al. | |
| 8,995,333 B2 | 3/2015 | Gruber et al. | |
| 9,467,195 B2 * | 10/2016 | Shapira | H04B 1/401 |
| 2012/0303836 A1 | 11/2012 | Ngo et al. | |
| 2013/0294554 A1 * | 11/2013 | Kadam | H04L 7/04 375/354 |
| 2013/0321675 A1 | 12/2013 | Cote et al. | |
| 2014/0038667 A1 | 2/2014 | Little et al. | |
| 2014/0106693 A1 | 4/2014 | Khlat | |
| 2014/0170990 A1 * | 6/2014 | Black | H04B 1/401 455/73 |

(Continued)

*Primary Examiner* — Brenda H Pham
(74) *Attorney, Agent, or Firm* — The Farrell Law Firm, P.C.

(57) ABSTRACT

Disclosed is a transmitting apparatus that includes an uplink transmitting unit that generates at least two carrier transmission signals carrier and generates transmission control data corresponding to the carrier transmission signals, a Radio Frequency Front End (RFFE) that transmits the at least two carrier transmission signals, and a transmission controller including a storage unit and decoders. The transmission controller activates a decoder corresponding to transmission control data output from the uplink transmitting unit, and the activated decoder accesses information of the storage unit to control wireless transmission of the RFFE.

20 Claims, 6 Drawing Sheets

(56) References Cited

U.S. PATENT DOCUMENTS

| | | |
|---|---|---|
| 2014/0287795 A1 | 9/2014 | Lee |
| 2014/0304442 A1 | 10/2014 | Hietala et al. |
| 2014/0325103 A1 | 10/2014 | Leitner et al. |
| 2016/0248451 A1* | 8/2016 | Weissman ............ H04B 1/0064 |
| 2016/0336631 A1* | 11/2016 | Lahteensuo ............ H01P 1/201 |

* cited by examiner

APPARATUS AND METHOD FOR CONTROLLING TRANSMISSION

PRIORITY

This application claims priority under 35 U.S.C. § 119(a) to Korean Patent Applications filed in the Korean Intellectual Property Office on Jun. 12, 2015 and assigned Serial No. 10-2015-0083396, and on Oct. 5, 2015 and assigned Serial no. 10-2015-0139635, the contents of each of which are hereby incorporated by reference.

BACKGROUND

1. Field of the Disclosure

The present disclosure relates to an apparatus and method for controlling transmission.

2. Description of the Related Art

A high-speed communication service is required in order to operate recently developed multimedia services. An apparatus for performing the communication service is also required to include additional functions to those of the conventional art. Accordingly, there is a need in the art for an electronic device having reduced hardware complexity while providing high-speed communication service.

SUMMARY

The present disclosure has been made to address the above-mentioned problems and disadvantages, and to provide at least the advantages described below.

Accordingly, an aspect of the present disclosure is to provide an apparatus and method for reducing hardware complexity while providing a high-speed communication service.

According to an aspect of the present disclosure, a transmitting apparatus includes an uplink transmitting unit that generates at least two carrier transmission signals for an uplink carrier aggregation and generates transmission control data corresponding to the carrier transmission signals, a radio frequency front end (RFFE) that transmits the at least two carrier transmission signals, and a transmission controller operatively coupled to the uplink transmitting unit and the RFFE and comprising a storage unit and a specific number of decoders when the specific number corresponds to the number of carriers, wherein the transmission controller activates a decoder corresponding to transmission control data which is output from the uplink transmitting unit, and the activated decoder accesses information of the storage unit to control wireless transmission of the RFFE.

According to another aspect of the present disclosure, a method of operating a transmitting apparatus includes generating at least two carrier transmission signals for an uplink carrier aggregation and generating transmission control data corresponding to the carrier transmission signals by an uplink transmitting unit comprised in the transmitting apparatus, transmitting the at least two carrier transmission signals by an RFFE comprised in the transmitting apparatus, activating a decoder that corresponds to transmission control data which is output from the uplink transmitting unit by a transmission controller comprised in the transmitting apparatus, the transmission controller being operatively coupled to the uplink transmitting unit and comprising a storage unit and a specific number of decoders when the specific number corresponds to the number of carriers, and accessing information of the storage unit to control wireless transmission of the RFFE by the activated decoder.

According to another aspect of the present disclosure, a chip set includes an uplink transmitting unit that generates at least two carrier transmission signals for an uplink carrier aggregation and generates transmission control data corresponding to the carrier transmission signals, an RFFE that transmits the at least two carrier transmission signals, and a transmission controller operatively coupled to the uplink transmitting unit and the RFFE and comprising a storage unit and a specific number of decoders when the specific number corresponds to the number of carriers, wherein the transmission controller activates a decoder corresponding to transmission control data which is output from the uplink transmitting unit, and the activated decoder accesses information of the storage unit to control wireless transmission of the RFFE.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Embodiments of the present disclosure are described herein with reference to the accompanying drawings. It should be understood, however, that it is not intended for the embodiments of the present disclosure to be limited to the particular form disclosed, but, on the contrary, the embodiments of the present disclosure are to cover all modifications, equivalents, and alternatives falling within the spirit and scope as defined by the appended claims. Like reference numerals denote like components throughout the drawings. Descriptions of well known functions and configurations will be omitted for the sake of clarity and conciseness.

A singular expression may include a plural expression unless there is a contextually distinctive difference. Unless otherwise defined, all terms (including technical and scientific terms) used herein have the same meaning as commonly understood by those ordinarily skilled in the art to which embodiments of the present disclosure pertain.

It will be further understood that terms, such as those defined in commonly used dictionaries, should be interpreted as having meanings that are consistent with their meaning in the context of the relevant art, and will not be interpreted in an idealized or overly formal sense unless expressly so defined herein. In addition, the terms defined in the present disclosure should not be interpreted to exclude the embodiments of the present disclosure.

For example, a hardware-based access method is described in embodiments of the present disclosure. However, since the embodiments of the present disclosure include a technique in which hardware and software are both used, a software-based access method is not excluded in the embodiments of the present disclosure.

In order to avoid a restriction of a supportable carrier aggregation combination, a transmitting apparatus supporting an uplink carrier aggregation includes a transmitter and an RFFE to support an entire frequency band. A synchronization of a transmission signal may be important in components related to transmission. For the above reasons, the transmitting apparatus supporting the uplink carrier aggregation includes a specific number of transmitters when the specific number corresponds to the number of component carriers (CCs), which are a respective plurality of carriers included in the carrier aggregation. For a synchronization of a transmission signal and transmission control data of the transmission signal, the transmitting apparatus includes a set of a specific number of RFFEs when the specific number corresponds to the number of transmitters.

An apparatus and an operational method thereof according to the embodiments provide a high-speed communication service through an uplink carrier aggregation of an RFFE. The transmitting apparatus according to embodiments of the present disclosure can decrease an area occupied by the RFFE since the RFFE in the device can support a multi-mobile industry processor interface (MIPI).

Figure 1A:
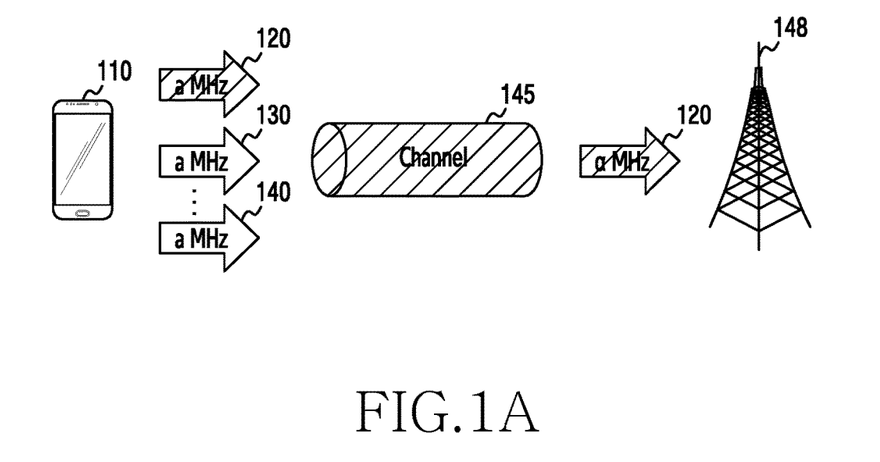
FIG. 1A illustrates the concept of uplink transmission to which the present disclosure is applied.

FIG. 1A illustrates the concept of uplink transmission to which the present disclosure is applied.

Referring to FIG. 1A, a transmitting apparatus 110 transmits a signal for communicating with other devices, such as a base station apparatus. The transmitting apparatus 110 may be a mobile station or a communication device of an electronic device having a communication function. The receiving device is receiving apparatus 148 such as a base station, an eNodeB, or an Access Point (AP). The transmitting apparatus according to embodiments of the present disclosure may be for uplink transmission of the electronic device having the communication function, such as a mobile device. The apparatus for receiving according to embodiments of the present disclosure may be for uplink reception of an apparatus of the base station or the AP.

The transmitting apparatus 110 transmits a signal to the receiving apparatus 148 through a channel by using one carrier among a plurality of carriers. The channel may be a channel corresponding to one carrier. For example, the transmitting apparatus 110 selects one carrier for signal transmission among carriers 120, 130, and 140 including a bandwidth of MHz. The transmitting apparatus 110 transmits a signal to the receiving apparatus 148 through a channel 145 corresponding to carrier 120 by using the selected carrier 120.

Figure 1B:
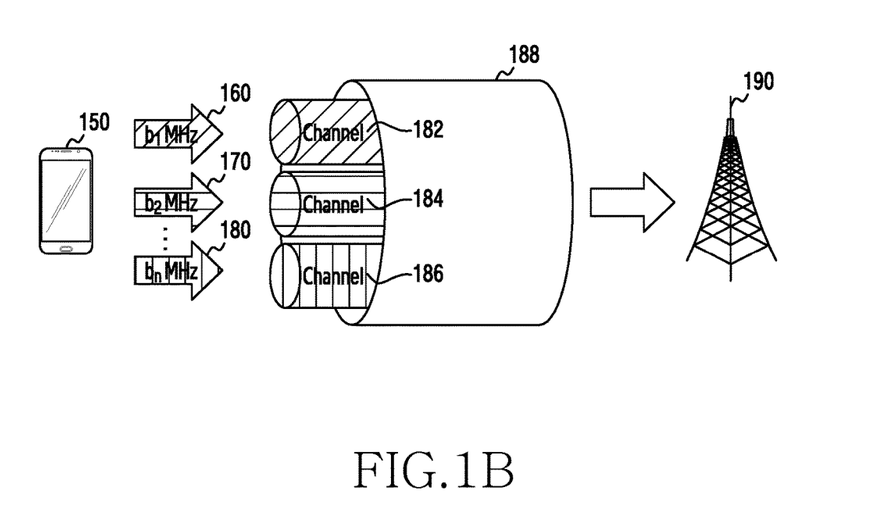
FIG. 1B illustrates uplink transmission using a carrier aggregation according to embodiments of the present disclosure.

FIG. 1B illustrates uplink transmission using a carrier aggregation according to embodiments of the present disclosure.

Carrier aggregation is a technique of transmitting a signal by using a plurality of carriers. Carrier aggregation may be performed by combining different radio access technologies. For example, carrier aggregation may be performed through combination of long term evolution (LTE) technologies, combination of the LTE technology and a 3rd generation (3G) technology, and combination of LTE technology and a wireless fidelity (Wi-Fi) technology. A device using carrier aggregation may utilize additional radio resources for signal transmission.

Carrier aggregation is constructed of a plurality of carriers referred to as a CC. Carrier aggregation is constructed of CCs of various combinations.

For example, carrier aggregation is constructed of a plurality of CCs continuously located within the same band, such as a high band (HB), middle band (MB), or a low band (LB). Carrier aggregation may be constructed of a plurality of CCs discontinuously located within the same band, or of a plurality of CCs located within different bands. An apparatus and an operational method thereof according to embodiments of the present disclosure implements carrier aggregation by using CCs of various combinations as described above.

Referring to FIG. 1B, in order to communicate with other devices or a receiving apparatus 190, a transmitting apparatus 150 transmits a signal to the receiving apparatus 190. The transmitting apparatus 150 is a mobile station, a user equipment (UE), or an electronic device, for example, and transmits a signal to other devices by using an uplink carrier aggregation. The receiving apparatus 190 is a base station, an eNodeB, an electronic device, or an access point (AP), for example. The receiving apparatus 190 receives a signal from other devices.

The transmitting apparatus 150 transmits a signal to the receiving apparatus 190 through a plurality of channels by using some carriers among a plurality of carriers. The plurality of channels respectively correspond to carriers among the plurality of carriers. For example, the transmitting apparatus 150 selects carrier 160 including a bandwidth of $b_1$ megahertz (MHz), carrier 170 including a bandwidth of $b_2$ MHz, and carrier 180 including a bandwidth of $b_n$ MHz for signal transmission. Carrier 160, carrier 170, and carrier 180 may be CCs. Each of the bandwidths $b_1, b_2, \ldots, b_n$ may have the same size or a different size. The transmitting apparatus 150 transmits a signal to the receiving apparatus 190 through channels 182, 184, and 186 respectively corresponding to the carriers by using carriers 160, 170, and 180. Channel 182, channel 184, and channel 186 are collectively referred to as an aggregated data pipe 188.

The transmitting apparatus according to embodiments of the present disclosure transmits an uplink signal by performing an uplink carrier aggregation function. The electronic device transmits an uplink radio frequency (RF) signal according to an MIPI standard. RFFEs of the electronic device control transmission of the uplink RF signal according to the MIPI standard. The transmitting apparatus may be constructed of hardware and software. From a hardware aspect, the transmitting apparatus includes processors of various manufacturers, and the processors may be coupled to other components in the transmitting apparatus. The processor includes an application program. The MIPI may be a standard for hardware and software between other components, such as a camera, a display, or an RFFE. The transmitting apparatus controls a serial interface communication operation between the processor and the RFFE.

Figure 2:
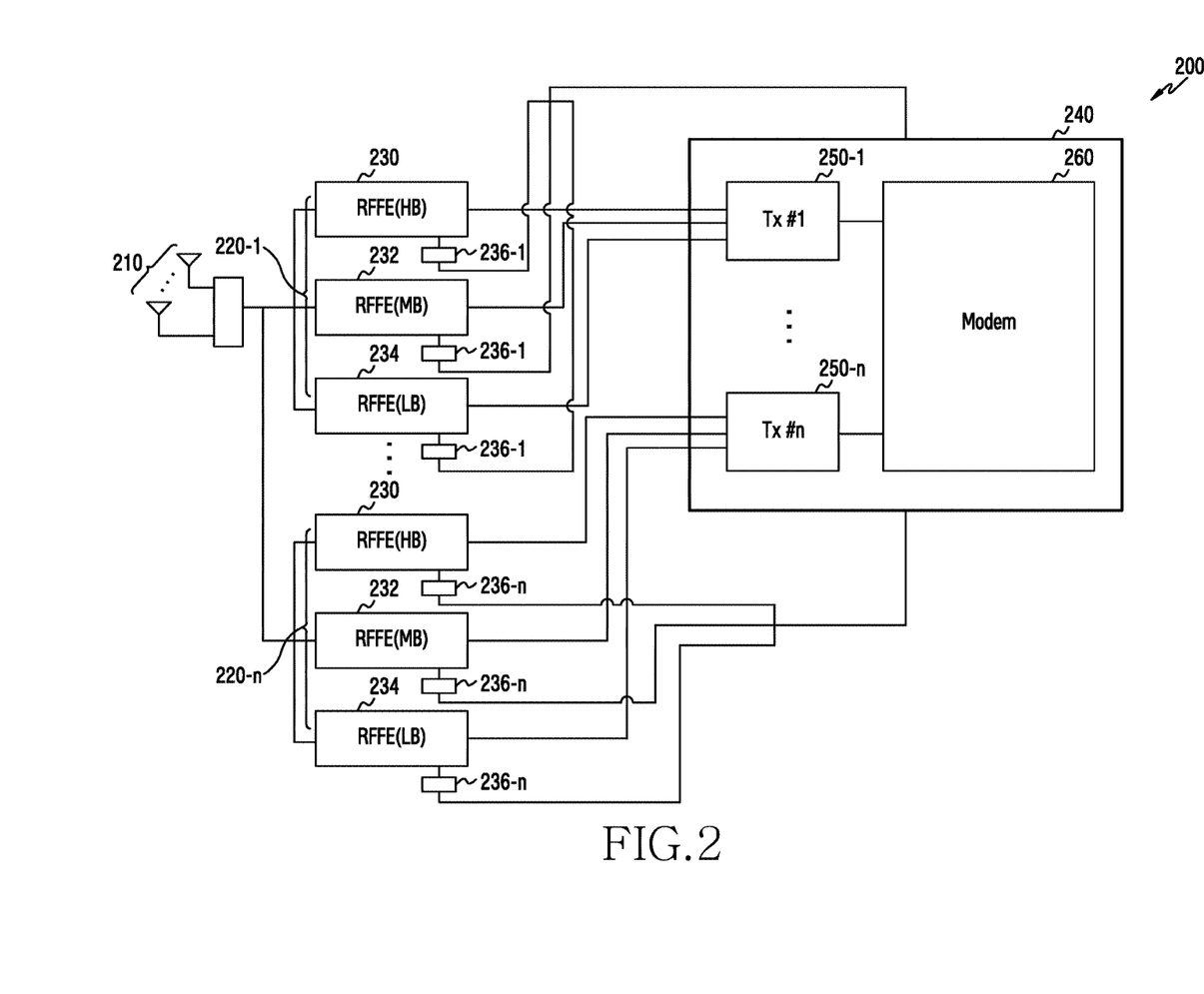
FIG. 2 is a block diagram of a transmitting apparatus including a plurality of single-transmission controllers for uplink transmission in the transmitting apparatus according to embodiments of the present disclosure.

FIG. 2 is a block diagram of a transmitting apparatus including a plurality of single-transmission controllers for uplink transmission in the transmitting apparatus according to embodiments of the present disclosure.

Referring to FIG. 2, an apparatus 200 for transmitting includes an antenna 210, RFFE sets 220-1 to 220-n, and a transmitting unit 240.

The antenna 210 includes one or more antennas. When the antenna 210 includes a plurality of antennas, each of the plurality of antennas may be used in signal transmission of a different band. For example, the antenna 210 includes one or more of an HB, MB, and LB antenna. The antenna 210 may be configured to conform to a multi input multi output (MIMO) scheme.

RFFE sets 220-1 to 220-n output a transmission signal through the antenna 210.

RFFE sets 220-1 to 220-n amplify the transmission signal for transmission and perform filtering on the transmission signal so that the transmission signal is transmitted in association with a band of the transmission signal. Each of the RFFE sets may be configured in association with a transmitter for synchronization between the RFFE sets. For example, RFFE set 220-1 corresponds to a transmitter 250-1 included in the transmitting unit 240, and RFFE set 220-n corresponds to a transmitter 250-n included in the transmitting unit 240.

Each of RFFE sets 220-1 to 220-n includes one or more of an RFFE (HB) 230, an RFFE (MB) 232, and an RFFE (LB) 234. Each RFFE included in RFFE sets 220-1 to 220-n includes transmission controllers 236-1 to 236-n. For example, each of RFFE (HB) 230, RFFE (MB) 232, and RFFE (LB) 234 included in RFFE set 220-1 includes the transmission controller 236-1.

If the transmission signal is an HB signal, RFFE (HB) 230 amplifies power of the transmission signal, or performs filtering on the transmission signal in association with a band of the transmission signal. If the transmission signal is an MB signal, RFFE (MB) 232 amplifies power of the transmission signal, or performs filtering on the transmission signal in association with the band of the transmission signal. If the transmission signal is an LB signal, RFFE (LB) 234 amplifies power of the transmission signal, or performs filtering on the transmission signal in association with the band of the transmission signal.

The transmission controllers 236-1 to 236-n may respectively control corresponding RFFEs. Synchronization with the transmission signal is important in components, such as RFFE sets 220-1 to 220-n related to transmission. The transmission controllers 236-1 to 236-n receive transmission control data corresponding to the transmission signal from the transmitting unit 240, and synchronize the transmission signal and the RFFEs. For the synchronization of the transmission signal and the RFFEs, the transmission controllers 236-1 to 236-n may be configured for respective transmitters, such as by differing for the respective RFFE sets. For example, the transmission controller 236-1 of RFFE set 220-1 and the transmission controller 236-n of RFFE set 220-n may be different from each other.

Each of the transmission controllers 236-1 to 236-n includes one storage unit and one decoder, and controls transmission of an RF signal of a corresponding RFFE according to the MIPI standard.

The storage unit stores registers for controlling the RFFEs. Information for controlling the RFFEs includes information for a power amplifier included in each RFFE and a filter bank included in each RFFE.

The decoder receives the transmission control data from the transmitting unit 240, requests information corresponding to the transmission control data to the storage unit, receives the registers for controlling the RFFEs from the storage unit, and controls the RFFEs based on the registers for controlling the RFFEs.

The transmitting unit 240 includes the plurality of transmitters 250-1 to 250-n, and a modem 260.

The modem 260 performs modulation, depending on a communication system, based on a modulation scheme such as code division multiple access (CDMA), wideband code division multiple access (WCDMA), orthogonal schemes, such as orthogonal frequency division multiplexing (OFDM)), or non-orthogonal schemes, such as filter bank multi-carrier (FBMC).

The modem 260 generates a plurality of transmission signals transmitted by using a plurality of carriers including a primary carrier and at least one secondary carrier. Each of the plurality of transmission signals may be transmitted through a different channel. The channels respectively correspond to the carriers. Each of the transmission signals may have a different gain or transmission power according to a communication environment.

The modem 260 generates a plurality of pieces of transmission control data that respectively correspond to the plurality of transmission signals. Each of the plurality of pieces of transmission control data includes an identifier (ID) for identifying the corresponding transmission signal, and further includes one or more of information related to a gain of the corresponding transmission signal and information related to a band of the corresponding transmission signal.

The transmitters 250-1 to 250-n up-convert modulated transmission signals to RF signals. For a carrier aggregation, each of the transmitters 250-1 to 250-n corresponds to the number of carriers.

The RFFE of the transmitting apparatus transmits an uplink RF signal according to an MIPI standard. The transmission controller for controlling an RF transmission signal of the uplink RFFE includes registers and a decoder, which may be referred to as a core, for processing an MIPI signal. In this case, the transmission controller may be provided in a corresponding number according to the number of uplink CAs. For example, when using two carriers, such as a primary component carrier and one secondary component carrier, the transmitting apparatus must be capable of processing two MIPI signals. The transmitting apparatus according to embodiments of the present disclosure supports two MIPIs in the transmission controller. For this, each transmission controller may be configured such that the registers in the transmission controller are shared, and cores related to an external interface are provided according to the number of carriers.

Since a supportable carrier aggregation (CA) combination is restricted when a frequency of a base station such as a primary cell or secondary cells is fixed, the transmitting apparatus may be connected such that each transmission (TX) source can support all frequency bands. The uplink RFFE of the transmitting apparatus preferably uses an MIPI synchronized with the transmission signal in view of the importance of synchronization with the transmission signal.

In an uplink CA condition, each transmitting unit must have an MIPI for each RFFE TX. Therefore, an apparatus capable of configuring an RFFE and a transmission controller and a control method thereof are disclosed so that the transmitting apparatus according to embodiments can support an uplink CA without having to use an external switch by using components having a structure capable of processing a specific number of MIPIs when the specific number corresponds to the number of carriers.

Figure 3:
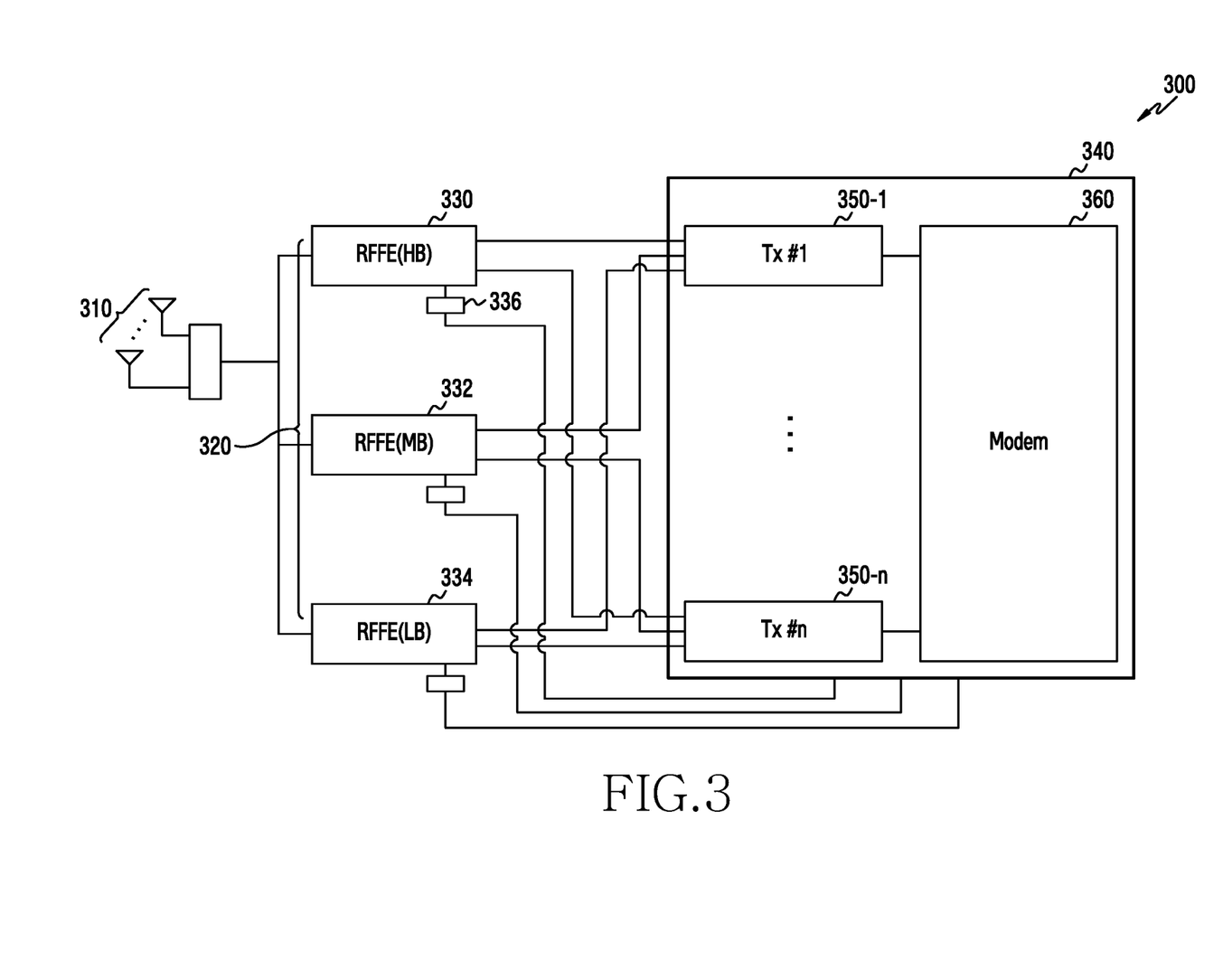
FIG. 3 illustrates a block diagram of a transmitting apparatus including multiple-transmission controllers according to embodiments of the present disclosure.

FIG. 3 illustrates a block diagram of a transmitting apparatus including multiple-transmission controllers according to embodiments of the present disclosure.

Referring to FIG. 3, a transmitting apparatus 300 includes an antenna 310, an RFFE set 320, and a transmitting unit 340.

The antenna 310 includes one or more antennas. When the antenna 310 includes a plurality of antennas, each of the plurality of antennas may be used in signal transmission of a different band. For example, the antenna 310 includes one or more of an HB, MB, and LB antenna, and conforms to a MIMO scheme.

RFFE set 320 outputs a transmission signal through the antenna 310.

RFFE set 320 amplifies the transmission signal for transmission. RFFE set 320 performs filtering on the transmission signal so that the transmission signal is transmitted in association with a band of the transmission signal. RFFE set 320 receives a plurality of transmission signals from a plurality of transmitters 350-1 to 350-n. The plurality of transmission signals includes different carrier transmission signals.

RFFE set 320 includes one or more of RFFE (HB) 330, RFFE (MB) 332, and RFFE (LB) 334. Each RFFE included in RFFE set 320 includes a transmission controller 336. Although it is shown in FIG. 3 that RFFE set 320 includes RFFE (HB) 330, RFFE (MB) 332, and RFFE (LB) 334, this is only an example, and thus RFFE set 320 may include more RFFEs. For a carrier aggregation, RFFE set 320 includes a specific number of RFFEs when the specific number is sufficient enough to accommodate the number of CCs.

If the transmission signal is an HB signal, RFFE (HB) 330 amplifies power of the transmission signal, or performs filtering on the transmission signal in association with a band of the transmission signal. If the transmission signal is an MB signal, RFFE (MB) 332 amplifies power of the transmission signal, or performs filtering on the transmission signal in association with the band of the transmission signal. If the transmission signal is an LB signal, RFFE (LB) 334 amplifies power of the transmission signal, or performs filtering on the transmission signal in association with the band of the transmission signal.

The transmission controller 336 controls transmission control data for synchronization between transmission related components, such as RFFE (HB) 330, RFFE (MB) 332, and RFFE (LB) 334, and the transmission signal. The transmission control data includes information for controlling RFFE set 320.

The transmission controller 336 may be configured with an MIPI.

Unlike the transmission controllers 236-1 to 236-n of FIG. 2, the transmission controller 336 includes a plurality of decoders and a storage unit.

The plurality of decoders respectively corresponds to the transmitters 350-1 to 350-n included in the transmitting unit 340. For example, the plurality of decoders includes a decoder corresponding to the transmitter 350-1, . . . , a decoder corresponding to the transmitter 350-n.

The plurality of decoders receives the transmission control data from the transmitting unit 340, requests information corresponding to the transmission control data to the storage unit, receives registers for controlling RFFE (HB) 330, RFFE (MB) 332, and RFFE (LB) 334 from the storage unit, and controls the RFFEs based on the registers for controlling the RFFEs.

The storage unit stores the registers for controlling the RFFEs. Information for controlling the RFFEs includes information for a power amplifier and a filter bank included in each RFFE.

The transmitting unit 340 includes the plurality of transmitters 350-1 to 350-n, and a modem 360.

The modem 360 performs modulation, depending on a communication system, based on a modulation scheme such as CDMA, WCDMA, OFDM, or FBMC, for example.

The modem 360 generates a plurality of transmission signals that may be transmitted by using a plurality of carriers including a primary carrier and at least one secondary carrier. Each of the plurality of transmission signals may be transmitted through a different channel. The channels respectively correspond to the carriers. Each of the transmission signals may have a different gain or transmission power according to a communication environment.

The modem 360 generates a plurality of pieces of transmission control data that respectively correspond to the plurality of transmission signals. Each of the plurality of pieces of transmission control data includes an ID for identifying the corresponding transmission signal, and includes one or more of information related to a gain of the corresponding transmission signal and information related to a band of the corresponding transmission signal.

The transmitters 350-1 to 350-n up-convert modulated transmission signals to RF signals. For a carrier aggregation, each of the transmitters 350-1 to 350-n corresponds to the number of carriers.

In the above example of FIG. 3, one or more of RFFE (HB) 330, RFFE (MB) 332, and RFFE (LB) 334 receives a plurality of transmission signals from the transmitting unit 340. The plurality of transmission signals may be transmitted to respective different RFFEs. In an embodiment, each of the plurality of transmission signals may be transmitted to the same RFFE. The RFFEs receive a plurality of pieces of transmission control data generated in association with the respective plurality of transmission signals from the transmitting unit 340 through the transmission controller 336. Each of the plurality of pieces of transmission control data are received from an RFFE which has received a transmission signal. Since the transmission controller 336 includes a plurality of decoders unlike the transmission controllers 236-1 to 236-n of FIG. 2, the transmitting apparatus 300 includes fewer RFFEs, such as RFFE set 320, in comparison with FIG. 2.

The respective plurality of decoders request registers for controlling the RFFEs corresponding to the received transmission control data to the storage unit. In response to the respective requests of the plurality of decoders, the storage unit provides the registers for controlling the RFFEs to each of the plurality of decoders. The respective plurality of decoders controls the RFFEs for outputting the transmission signals by using the registers corresponding to the transmission signals.

By using the aforementioned configuration, the transmitting apparatus 300 and an operational method thereof according to embodiments provides a high-speed communication service through an uplink carrier aggregation of an RFFE, and decreases an area occupied by the RFFE in the transmitting apparatus 300.

Figure 4:
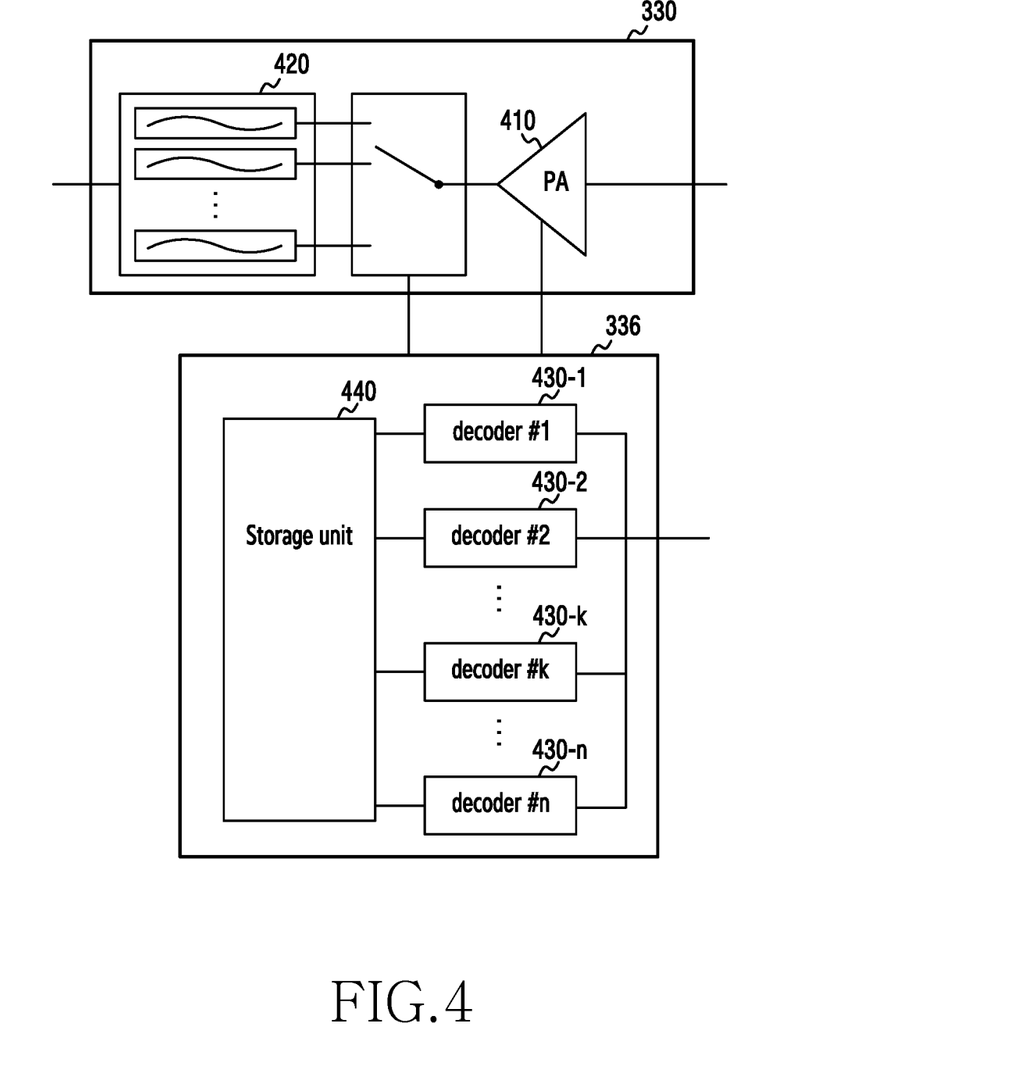
FIG. 4 illustrates a block diagram of an RFFE according to embodiments of the present disclosure.

FIG. 4 illustrates a block diagram of an RFFE according to embodiments of the present disclosure. This structure is included in one or more of RFFE (HB) 330, RFFE (MB) 332, and RFFE (L) 334 shown in FIG. 3.

Referring to FIG. 4, RFFE (HD) 330 includes a power amplifier (PA) 410, a filter band 420, and a transmission controller 336.

The PA 410 adjusts a gain of a transmission signal received in RFFE (HB) 330. For example, if a transmitting apparatus is located far away from a receiving apparatus, the PA 410 relatively increases the gain of the transmission signal. If the transmitting apparatus is located close to the receiving apparatus, the PA 410 relatively decreases the gain of the transmission signal.

The filter bank 420 includes a plurality of filters. The filter bank 420 selects the band of the transmission signal received in RFFE (HB) 330 by using the plurality of filters included in the filter bank 420. For example, if the transmission signal is a B2 band, the filter bank 420 selects the band of the transmission signal by using the filter corresponding to the B2 band.

The transmission controller 336 includes a plurality of decoders 430-1 to 430-n and a storage unit 440.

If transmission control data is received in the transmission controller 336, a decoder corresponding to the transmission control data may be activated among the plurality of decoders 430-1 to 430-n. For example, if $k^{th}$ transmission control data is received in the transmission controller 336, the decoder 430-k corresponding to the $k^{th}$ transmission control data is activated. Whether the decoder 430-k corresponds to the $k^{th}$ transmission control data is determined through an ID included in the $k^{th}$ transmission control data. The decoder 430-k requests a register corresponding to the $k^{th}$ transmission control data to the storage unit 440.

The register corresponds to a transmission signal or an RFFE which has received the transmission signal. The register includes information for controlling the RFFE which has received the transmission signal. The storage unit 440 provides the register to the decoder 430-k, which controls the RFFE which has received the transmission signal based on the register. For example, the decoder 430-k adjusts a gain of the transmission signal by controlling the PA included in the RFFE which has received the transmission signal based on the register. Alternatively, the decoder 430-k adjusts the band of the transmission signal by controlling the filter bank included in the RFFE which has received the transmission signal based on the register.

The transmission controller 336 may be constructed with an MIPI, in which case the storage unit 440 includes registers shown in Table 1 below.

TABLE 1

| Register Address (Hex.) | Register Name | Data Bits | Function | Default | | Description | BROADCAST_ID Support | Trigger Support | R/W |
|---|---|---|---|---|---|---|---|---|---|
| 0x0000 | PA_CTRL0 | 7 | RESERVED | 0 | | Reserved | No | Yes | R/W |
| | | 6:3 | BAND | 0 | PA Band Selection | 0000: PA Disabled 0001: B1 0010: B25 0011: B3 0100: B4 0101: B39 0110: B34 0111: GSM HB | | | |
| | | 2 | PA_ENABLE | 0 | Bit which enables PA | 0: PA Off 1: PA On | | | |
| | | 1:0 | PA_MODE | 0 | Bits which determine the mode of the PA | 00: ET HPM or GSM HPM 01: APT HPM or GSM MPM 10: APT LPM or GSM LPM 11: GSM ULPM | | | |
| 0x0001 | BIAS_CTRL | 7:0 | BIAS1[7:0] | 0000 0000 | Power level dependent bias control | 00000000: Minimum Bias 11111111: Maximum Bias | No | Yes | R/W |

In Table 1, register 0x0000 defines a band of the PA, an activation status, and a mode, and register 0x0001 defines a bias of the PA. The transmission controller 336 controls the bias so that the RFFE provides optimum capability.

The storage unit 440 may further include registers shown in Table 2 below.

TABLE 2

| | | | | | | | | | |
|---|---|---|---|---|---|---|---|---|---|
| 0x001D | PRODUCT_ID | 7:0 | PRODUCT_ID[7:0] | 0000 0010 | | This is a read-only register. However, during the programming of the USID a write command sequence is performed on this register, even though the write does not change its value. | No | No | R |
| 0x001E | MANUFACTURER_ID | 7:0 | MANUFACTURER_ID[7:0] | Vendor Specific | | This is a read-only register. However, during the programming of the USID, a write command sequence is performed on this register, even though the write does not change its value. | No | No | R |
| 0x001F | MAN_USID | 7:6 | SPARE[1:0] | 00 | | These are read-only bits that are reserved and yield a value of 0b00 at readback. | No | No | R |
| | | 5:4 | MANUFACTURER_ID[9:8] | Vendor Specific | | These bits are read-only. However, during the programming of the USID, a write command sequence is performed on this register even though the write does not change its value. | | | R |
| | | 3:0 | USID[3:0] | 1110 | | Programmable USID. Performing a write to this register using the described programming sequences will program the USID in devices supporting this feature. These bits store the USID of the device. | | | R/W |

The registers in Table 2 are defined to identify a unique ID of components of the RFFE. The registers in Table 2 correspond to a transmission signal received in the RFFE.

The storage unit 440 includes a plurality of sets of the registers included in Table 1 and in Table 2.

Figure 5:
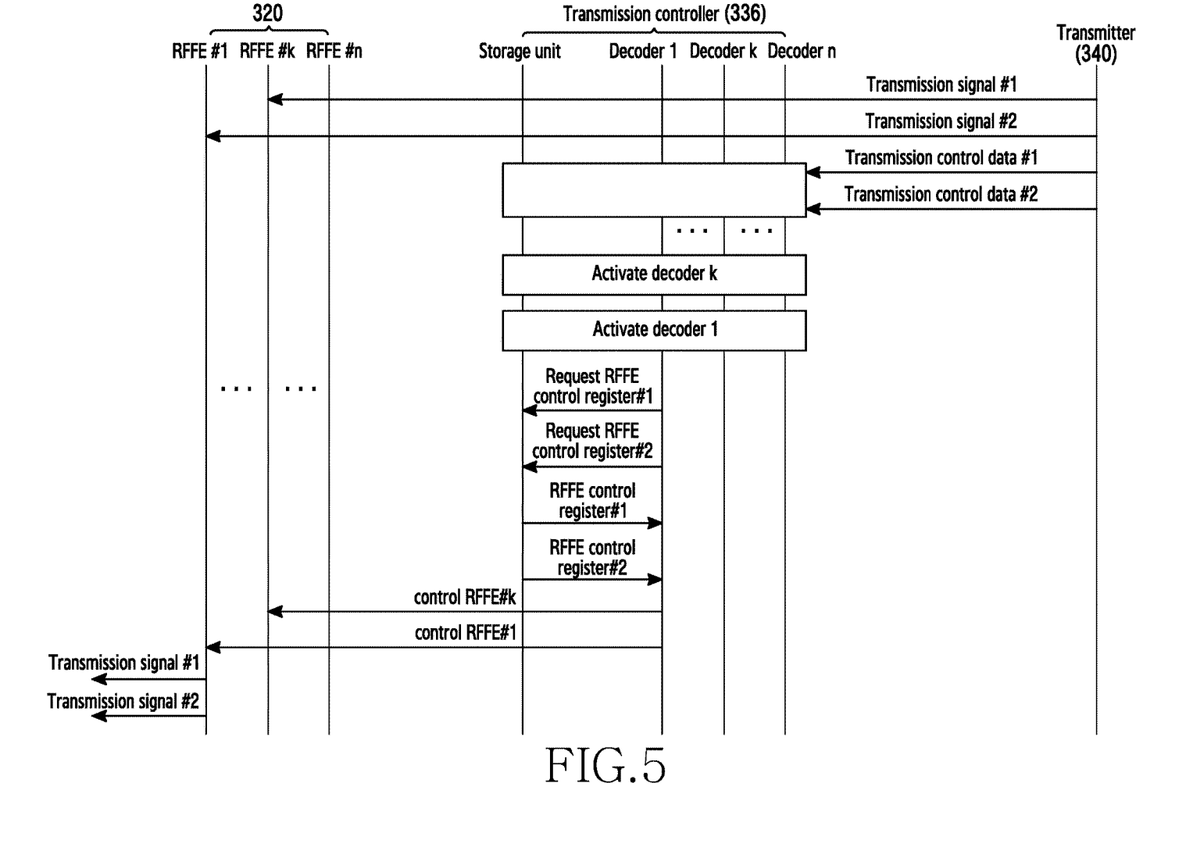
FIG. 5 illustrates an output procedure of a transmission signal according to embodiments of the present disclosure.

FIG. 5 illustrates an output procedure of a transmission signal according to embodiments of the present disclosure. Although an example of an uplink carrier aggregation in which two transmission signals are transmitted by using two carriers is assumed in FIG. 5, a transmitting apparatus and an operational method thereof according to embodiments can provide an uplink carrier aggregation in which a plurality of transmission signals are transmitted by using a plurality of carriers. The procedure of FIG. may be performed by the transmitting unit 340, RFFE set 320, and transmitting unit 340 included in the transmitting apparatus 300 of FIG. 3.

Referring to FIG. 5, the transmitting unit 340 generates transmission signal #1 and transmission signal #2, and generates transmission control data #1 corresponding to transmission signal #1 and transmission control data #2 corresponding to transmission signal #2. The transmitting unit 340 transmits transmission signal #1 to RFFE #k, and transmits transmission control data #1 to transmission controller 336. The transmitting unit 340 transmits transmission signal #2 to RFFE #1, and transmits transmission control data #2 to the transmission controller 336. Transmission control data #1 activates a decoder k corresponding to a transmitter 350-*k* included in the transmitting unit 340. Transmission control data #2 activates a decoder 1 corresponding to a transmitter 350-1 included in the transmitting unit 340.

The decoder k requests an RFFE control register #1 to the storage unit 440 included in the transmitting unit 340, and the decoder 1 requests an RFFE control register #2 to the storage unit 440.

The storage unit 440 provides the RFFE control registers #1 and #2 to the decoder in response to a request of the decoder k and the decoder 1.

The decoder k controls RFFE #k based on RFFE control register #1. For example, the decoder k controls a PA included in RFFE #k based on RFFE control register #1, or controls a filter bank included in RFFE #k.

The decoder 1 controls RFFE #1 based on RFFE control register #2. For example, the decoder 1 controls a PA included in RFFE #1 based on RFFE control register #2, or controls a filter bank included in RFFE #1.

RFFE #k determines a gain of the transmission signal #1 based on the control of the decoder k, and selects a band to output transmission signal #1.

RFFE #1 determines a gain of transmission signal #2 based on the control of the decoder 1, and selects a band to output transmission signal #2.

Methods based on the embodiments disclosed in the claims or specification of the present disclosure can be implemented in hardware, software, or a combination of both. For example, the embodiments of the present disclosure can be implemented in a chip set.

When implemented in software, computer readable recording medium for storing one or more programs (i.e., software modules) can be provided. The one or more programs stored in the computer readable recording medium are configured for execution performed by one or more processors in the electronic device. The one or more programs include instructions for allowing the electronic device to execute the methods based on the embodiments disclosed in the claims and/or specification of the present disclosure.

The program (i.e., the software module or software) can be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program can be stored in a memory configured in combination of all or some of these storage media. The configured memory can be plural in number.

The program can be stored in an attachable storage device capable of accessing the electronic device through a communication network such as the Internet, an Intranet, a local area network (LAN), a wide LAN (WLAN), a storage area network (SAN) or a communication network configured by combining the networks. The storage device can have an access to a device for performing an embodiment of the present disclosure via an external port. An additional storage device on a communication network can have an access to the device for performing an embodiment of the present disclosure.

In the aforementioned embodiments of the present disclosure, a component is expressed in a singular or plural form according to the particular embodiment. However, the singular or plural expression is selected for the convenience of explanation, and thus the disclosure is not limited to one or a plurality of components. Therefore, a component expressed in a plural form can also be expressed in a singular form, or vice versa.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure is defined not by the detailed description thereof but by the appended claims, and all differences within equivalents of the scope will be construed as being included in the present disclosure.

What is claimed is:

1. A transmitting apparatus, comprising;
   an uplink transmitting unit that generates at least two carrier transmission signals for an uplink carrier aggregation and generates transmission control data corresponding to the carrier transmission signals;
   a radio frequency front end (RFFE) that transmits the at least two carrier transmission signals; and
   a transmission controller operatively coupled to the uplink transmitting unit and the RFFE and comprising a storage unit and a specific number of decoders when the specific number corresponds to the number of carriers,
   wherein the transmission controller activates a decoder corresponding to transmission control data which is output from the uplink transmitting unit, and the activated decoder accesses information of the storage unit to control wireless transmission of the RFFE.

2. The apparatus of claim 1, wherein the transmission controller comprises:
   the storage unit that stores band selection information for transmitting each of component carriers; and
   the decoders that respectively correspond to the component carriers,
   wherein the decoders are activated in association with the transmission control data which is output from the uplink transmitting unit, and select a filter of the RFFE corresponding to band selection information accessed in the storage unit.

3. The apparatus of claim 2, wherein the RFFE comprises:
a power amplifier that amplifies power of a carrier transmission signal;
a filter bank comprising at least two filters; and
a switch that connects an output of the power amplifier to a filter corresponding to the filter bank by being switched by the band selection in formation.

4. The apparatus of claim 3, wherein the storage unit further comprises gain information of the power amplifier corresponding to the band selection information, and
wherein the decoder supplies the band selection information and the gain information respectively to the switch and the power amplifier.

5. The apparatus of claim 1, wherein each piece of the transmission control data comprises an identifier (ID) that identifies a corresponding transmission signal, and comprises one or more of information related to a gain of the corresponding carrier transmission signal and information related to a band of the corresponding carrier transmission signal.

6. The apparatus of claim 5, wherein the transmission controller activates the decoder based on the ID, and controls a power amplifier comprised in the at least one RFFE based on information of the storage unit corresponding to the gain of the carrier transmission signal.

7. The apparatus of claim 5, wherein the transmission controller activates the decoder based on the ID, and controls a filter bank included in the at least one RFFE based on information of a register corresponding to the band of the carrier transmission signal.

8. The apparatus of claim 7, wherein the transmission controller controls the power amplifier included in the at least one RFFE based on information of the register corresponding to the gain of the carrier transmission signal.

9. The apparatus of claim 1, wherein the at least two carrier transmission signals comprise a primary carrier transmission signal and at least one secondary carrier transmission signal.

10. The apparatus of claim 1, wherein the transmission controller is capable of conforming to a Mobile Industry Processor Interface (MIPI) standard, and
wherein the plurality of decoders is a plurality of cores included in the MIPI standard.

11. A method of operating a transmitting apparatus, comprising:
generating at least two carrier transmission signals for an uplink carrier aggregation and generating transmission control data corresponding to the carrier transmission signals by an uplink transmitting unit comprised in the transmitting apparatus;
transmitting the at least two carrier transmission signals by a radio frequency front end (RFFE) comprised in the transmitting apparatus;
activating a decoder that corresponds to transmission control data which is output from the uplink transmitting unit by a transmission controller comprised in the transmitting apparatus, the transmission controller, which is operatively coupled to the uplink transmitting unit and the RFFE, comprising a storage unit and a specific number of decoders when the specific number corresponds to the number of carriers; and
accessing information of the storage unit to control wireless transmission of the RFFE by the activated decoder.

12. The method of claim 11, wherein the storage unit stores band selection information for transmitting each of component carriers, and
wherein controlling the wireless transmission of the RFFE comprises selecting a filter of the RFFE corresponding to band selection information accessed in the storage unit by the decoder respectively corresponding to the component carriers and activated in association with the transmission control data which is output from the uplink transmitting unit.

13. The method of claim 12, wherein the RFFE comprises:
a power amplifier that amplifies power of a carrier transmission signal;
a filter bank comprising at least two filters; and
a switch that connects an output of the power amplifier to a filter corresponding to the filter bank by being switched by the band selection in formation.

14. The method of claim 13,
wherein the storage unit further comprises gain information of the power amplifier corresponding to the band selection information, and
wherein the decoder further supplies the band selection information and the gain information respectively to the switch and the power amplifier.

15. The method of claim 11, wherein each piece of the transmission control data comprises an identifier (ID) that identifies a corresponding transmission signal, and comprises one or more of information related to a gain of the corresponding transmission signal and information related to a band of the corresponding transmission signal.

16. The method of claim 15, wherein controlling of the wireless transmission of the RFFE by the transmission controller comprises:
activating the decoder based on the ID; and controlling a power amplifier comprised in the RFFE based on information of the storage unit corresponding to the gain of the transmission signal.

17. The method of claim 15, wherein controlling the wireless transmission of the RFFE by the transmission controller comprises:
activating the decoder based on the ID; and
controlling a filter bank comprised in the RFFE based on information of a register corresponding to the band of the transmission signal.

18. The method of claim 17, wherein controlling the wireless transmission of the RFFE by the transmission controller comprises controlling the power amplifier included in the RFFE based on information of the register corresponding to the gain of the transmission signal.

19. The method of claim 11, wherein the at least two carrier transmission signals comprise a primary carrier transmission signal and at least one secondary carrier transmission signal.

20. The method of claim 11, wherein the transmission controller is capable of conforming to a mobile industry processor interface (MIPI) standard, and
wherein the plurality of decoders is a plurality of cores included in the MIPI standard.

* * * * *